(12) United States Patent
Xu et al.

(10) Patent No.: US 8,942,945 B2
(45) Date of Patent: Jan. 27, 2015

(54) SYSTEM AND METHOD FOR PROSPECTIVE CORRECTION OF HIGH ORDER EDDY-CURRENT-INDUCED DISTORTION IN DIFFUSION-WEIGHTED ECHO PLANAR IMAGING

(75) Inventors: Dan Xu, Oconomowoc, WI (US); Joseph K. Maier, Milwaukee, WI (US); Kevin F. King, Menomonee Falls, WI (US); Bruce David Collick, Madison, WI (US)

(73) Assignee: General Electric Company, Schenectady, NY (US)

( * ) Notice: Subject to any disclaimer, the term of this patent is extended or adjusted under 35 U.S.C. 154(b) by 456 days.

(21) Appl. No.: 13/364,003

(22) Filed: Feb. 1, 2012

(65) Prior Publication Data
US 2012/0271584 A1 Oct. 25, 2012

Related U.S. Application Data

(60) Provisional application No. 61/476,936, filed on Apr. 19, 2011.

(51) Int. Cl.
*G01R 33/565* (2006.01)
*G01R 33/563* (2006.01)
*G01R 33/561* (2006.01)

(52) U.S. Cl.
CPC ...... *G01R 33/56518* (2013.01); *G01R 33/5616* (2013.01); *G01R 33/56341* (2013.01)
USPC .......................................... 702/106; 324/318

(58) Field of Classification Search
CPC ................................................ G01R 33/56518
USPC ......................................................... 702/106
See application file for complete search history.

(56) References Cited

U.S. PATENT DOCUMENTS

| 4,698,591 A | 10/1987 | Glover et al. |
| 5,864,233 A | 1/1999 | Zhou et al. |
| 6,211,675 B1 | 4/2001 | Ganin et al. |
| 6,335,620 B1 | 1/2002 | Weissenberger |
| 2011/0025325 A1* | 2/2011 | Li et al. ........................ 324/307 |
| 2012/0271583 A1* | 10/2012 | Xu et al. ....................... 702/104 |

OTHER PUBLICATIONS

Reese et al., "Reduction of Eddy-Current-Induced Distortion in Diffusion MRI Using a Twice-Refocused Spin Echo," Magnetic Resonance in Medicine, vol. 49, pp. 177-182, 2003.

* cited by examiner

*Primary Examiner* — Bryan Bui
(74) *Attorney, Agent, or Firm* — Ziolkowski Patent Solutions Group, SC

(57) ABSTRACT

A computer is programmed to acquire calibration data from a calibration scan, the calibration data configured to characterize high order eddy current (HOEC) generated magnetic field error of an imaging system. The computer is also programmed to process the calibration data to generate a plurality of basis coefficients and a plurality of time constants and to calculate a plurality of basis correction coefficients based on the plurality of basis coefficients, the plurality of time constants, and gradient waveforms in a given pulse sequence. The computer is further programmed to execute a diffusion-weighted imaging scan that comprises application of a DW-EPI pulse sequence to acquire MR data from an imaging subject and reconstruction of an image based on the acquired MR data. The computer is also programmed to apply HOEC-generated magnetic field error correction during application of the DW-EPI pulse sequence configured to reduce HOEC-induced distortion in the reconstructed image.

20 Claims, 5 Drawing Sheets

SYSTEM AND METHOD FOR PROSPECTIVE CORRECTION OF HIGH ORDER EDDY-CURRENT-INDUCED DISTORTION IN DIFFUSION-WEIGHTED ECHO PLANAR IMAGING

CROSS REFERENCE TO RELATED APPLICATIONS

The present application is a non-provisional of, and claims priority to, U.S. Provisional Patent Application Ser. No. 61/476,936, filed Apr. 19, 2011, the disclosure of which is incorporated herein by reference.

BACKGROUND OF THE INVENTION

Embodiments of the invention relate generally to magnetic resonance (MR) imaging and, more particularly, to correcting high order eddy-current-induced distortion in diffusion-weighted echo planar imaging.

When a substance such as human tissue is subjected to a uniform magnetic field (polarizing field $B_0$), the individual magnetic moments of the spins in the tissue attempt to align with this polarizing field, but precess about it in random order at their characteristic Larmor frequency. If the substance, or tissue, is subjected to a magnetic field (excitation field $B_1$) which is in the x-y plane and which is near the Larmor frequency, the net aligned moment, or "longitudinal magnetization", $M_z$, may be rotated, or "tipped", into the x-y plane to produce a net transverse magnetic moment $M_t$. A signal is emitted by the excited spins after the excitation signal $B_1$ is terminated and this signal may be received and processed to form an image.

When utilizing these signals to produce images, magnetic field gradients ($G_x$, $G_y$, and $G_z$) are employed. Typically, the region to be imaged is scanned by a sequence of measurement cycles in which these gradients vary according to the particular localization method being used. The resulting set of received NMR signals are digitized and processed to reconstruct the image using one of many well known reconstruction techniques.

It is well known that Diffusion-Weighted Echo Planar Imaging (DW-EPI) often suffers from diffusion encoding direction dependent distortions due to diffusion gradient generated eddy current field. These distortions, if not corrected, can lead to mis-registration among DW images of different directions and inaccuracies in any post processing operations involving DW image combination. Dual spin echo (also called twice refocused) DW-EPI has been proposed to provide a certain level of inherent eddy current cancellation, but with a significant increase in echo time and decrease in signal-to-noise ratio (SNR). For example, a typical dual spin echo protocol may generate about half as much SNR as the corresponding single spin echo (also called Stejkal-Tanner sequence) protocol on liver imaging at 3 T. In many cases (e.g., whole body DW-EPI), increasing NEX is not an option to increase SNR because of the associated increase in scan time. Therefore, it is desirable to keep single spin-echo while reducing the resulting distortion in practice.

Conventional distortion correction methods have focused on correcting only the linear and constant eddy currents (also called $B_0$ eddy currents), either by pre-emphasis or by explicitly modifying gradient waveforms and receive frequency. However, uncompensated eddy currents of high spatial order due to gradient coil leakage field, or simply high order eddy currents (HOEC), can also be significant with the desire for increased b values and the increase of gradient amplitude and slew rate in modern MR scanners. Because of the high spatial order, distortions generated by the magnetic fields created by these eddy currents are not only diffusion gradient direction dependent, but also slice dependent.

It would therefore be desirable to have a system and method capable of correcting distortion due to HOEC in DW-EPI.

BRIEF DESCRIPTION OF THE INVENTION

In accordance with one aspect of the invention, an MRI apparatus comprises a magnetic resonance imaging (MRI) system having a plurality of gradient coils positioned about a bore of a magnet, and an RF transceiver system and an RF switch controlled by a pulse module to transmit RF signals to an RF coil assembly to acquire MR images. The MRI apparatus also comprises a computer programmed to acquire calibration data from a calibration scan, the calibration data configured to characterize high order eddy-current-generated magnetic field error of an imaging system. The computer is also programmed to process the calibration data to generate a plurality of basis coefficients and a plurality of time constants and to calculate a plurality of basis correction coefficients based on the plurality of basis coefficients, the plurality of time constants, and gradient waveforms in a given pulse sequence. The computer is further programmed to execute a diffusion-weighted imaging scan that comprises application of a DW-EPI pulse sequence to acquire MR data from an imaging subject and reconstruction of an image based on the acquired MR data. The computer is also programmed to apply high order eddy-current-generated magnetic field error correction during application of the DW-EPI pulse sequence configured to reduce high order eddy-current-induced distortion in the reconstructed image.

In accordance with another aspect of the invention, a method for correcting high order eddy-current-induced distortions in diffusion-weighted echo planar imaging (DW-EPI) comprises acquiring calibration data from a calibration scan, the calibration data configured to characterize high order eddy currents of an imaging system, processing the calibration data to generate a plurality of basis coefficients and a plurality of time constants, and calculating a plurality of basis correction coefficients based on the plurality of basis coefficients and based on the plurality of time constants. The method also comprises applying a DW-EPI pulse sequence to acquire MR data from an imaging subject, applying high order eddy current generated magnetic field error correction during application of the DW-EPI pulse sequence to reduce high order eddy-current-induced distortion in the acquired MR data, and reconstructing an image based on the acquired MR data.

In accordance with yet another aspect of the invention, a non-transitory computer readable medium having stored thereon a computer program comprising a set of instructions, which, when executed by a computer, causes the computer to acquire calibration data from a calibration scan configured to characterize high order eddy current generated magnetic field error of an imaging system and to process the calibration data. The set of instructions also causes the computer to generate a plurality of basis coefficients and a plurality of time constants based on the processed calibration data and to calculate a plurality of basis correction coefficients based on the plurality of basis coefficients, the plurality of time constants, and gradient waveforms in a DW-EPI pulse sequence. The set of instructions also causes of the computer to apply the DW-EPI pulse sequence to acquire MR data from an imaging subject, to apply high order eddy current generated magnetic field error correction during application of the DW-EPI pulse sequence, and to reconstruct an image based on the acquired MR data.

Various other features and advantages will be made apparent from the following detailed description and the drawings.

BRIEF DESCRIPTION OF THE DRAWINGS

The drawings illustrate embodiments presently contemplated for carrying out embodiments of the invention.

In the drawings.

DETAILED DESCRIPTION

Figure 1:
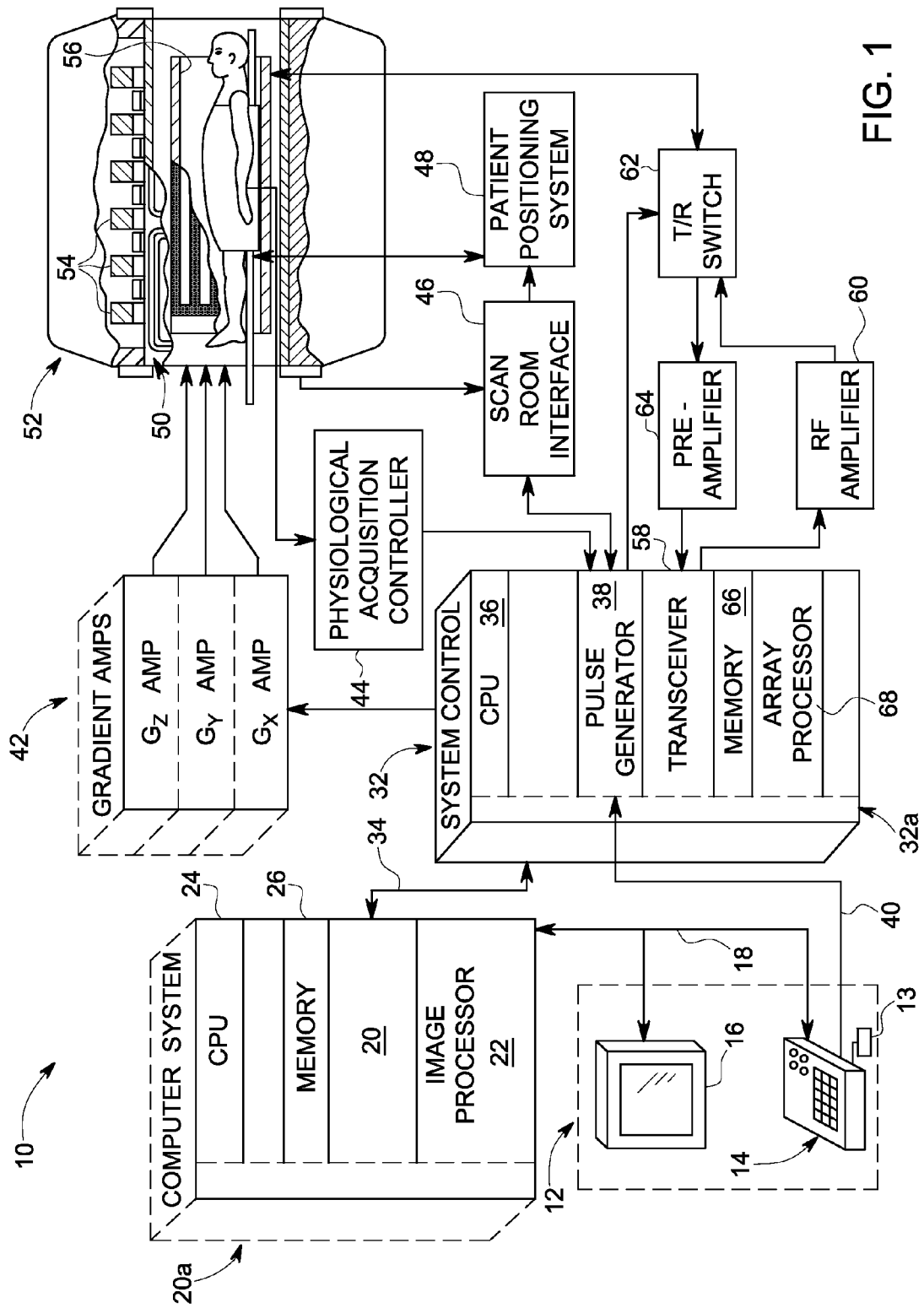
FIG. 1 is a schematic block diagram of an MR imaging system for use with embodiments of the invention.

Referring to FIG. 1, the major components of a magnetic resonance imaging (MRI) system 10 incorporating an embodiment of the invention are shown. The operation of the system is controlled for certain functions from an operator console 12 which in this example includes a keyboard or other input device 13, a control panel 14, and a display screen 16. The console 12 communicates through a link 18 with a separate computer system 20 that enables an operator to control the production and display of images on the display screen 16. The computer system 20 includes a number of modules which communicate with each other through a backplane 20a. These modules include an image processor module 22, a CPU module 24 and a memory module 26, known in the art as a frame buffer for storing image data arrays. The computer system 20 communicates with a separate system control 32 through a high speed serial link 34. The input device 13 can include a mouse, joystick, keyboard, track ball, touch activated screen, light wand, voice control, card reader, push-button, or any similar or equivalent input device, and may be used for interactive geometry prescription.

The system control 32 includes a set of modules connected together by a backplane 32a. These include a CPU module 36 and a pulse generator module 38 which connects to the operator console 12 through a serial link 40. It is through link 40 that the system control 32 receives commands from the operator to indicate the scan sequence that is to be performed. The pulse generator module 38 operates the system components to carry out the desired scan sequence and produces data which indicates the timing, strength and shape of the RF pulses produced, and the timing and length of the data acquisition window. The pulse generator module 38 connects to a set of gradient amplifiers 42, to indicate the timing and shape of the gradient pulses that are produced during the scan. The pulse generator module 38 can also receive patient data from a physiological acquisition controller 44 that receives signals from a number of different sensors connected to the patient, such as ECG signals from electrodes attached to the patient. And finally, the pulse generator module 38 connects to a scan room interface circuit 46 which receives signals from various sensors associated with the condition of the patient and the magnet system. It is also through the scan room interface circuit 46 that a patient positioning system 48 receives commands to move the patient to the desired position for the scan.

The gradient waveforms produced by the pulse generator module 38 are applied to the gradient amplifier system 42 having Gx, Gy, and Gz amplifiers. Each gradient amplifier excites a corresponding physical gradient coil in a gradient coil assembly generally designated 50 to produce the magnetic field gradients used for spatially encoding acquired signals. The gradient coil assembly 50 forms part of a resonance assembly 52 which includes a polarizing magnet 54 and a whole-body RF coil 56. A transceiver module 58 in the system control 32 produces pulses which are amplified by an RF amplifier 60 and coupled to the RF coil 56 by a transmit/receive switch 62. The resulting signals emitted by the excited nuclei in the patient may be sensed by the same RF coil 56 and coupled through the transmit/receive switch 62 to a preamplifier 64. The amplified MR signals are demodulated, filtered, and digitized in the receiver section of the transceiver 58. The transmit/receive switch 62 is controlled by a signal from the pulse generator module 38 to electrically connect the RF amplifier 60 to the coil 56 during the transmit mode and to connect the preamplifier 64 to the coil 56 during the receive mode. The transmit/receive switch 62 can also enable a separate RF coil (for example, a surface coil) to be used in either the transmit or receive mode.

The MR signals picked up by the RF coil 56 are digitized by the transceiver module 58 and transferred to a memory module 66 in the system control 32. A scan is complete when an array of raw k-space data has been acquired in the memory module 66. This raw k-space data is rearranged into separate k-space data arrays for each image to be reconstructed, and each of these is input to an array processor 68 which operates to Fourier transform the data into an array of image data. This image data is conveyed through the serial link 34 to the computer system 20 where it is stored in memory. In response to commands received from the operator console 12 or as otherwise directed by the system software, this image data may be archived in long term storage or it may be further processed by the image processor 22 and conveyed to the operator console 12 and presented on the display 16.

Embodiments of the invention correct high order eddy current (HOEC) induced diffusion gradient direction dependent distortion in Diffusion-Weighted Echo Planar Imaging (DW-EPI). As used herein, "high order" means spatial order higher than or equal to 2, as compared to linear and constant orders, which mean order 1 and 0, respectively. However, embodiments of the invention can also be applied to linear and constant orders as well. The distortions due to HOEC may strongly affect the acquired data, especially for body applications where large FOV is used and large slice coverage is desired. As discussed herein, a system calibration may be used to characterize eddy currents of spatial orders less than or equal to P, where P is usually 3 to 5, but can be any order in general. DW-EPI pulse sequence with correction amplitudes for gradients in readout, phase encoding, and slice axes, and receiver frequency on a per-slice basis may be played to prospectively remove the effect of the quasi-linear HOEC terms.

Figure 2:
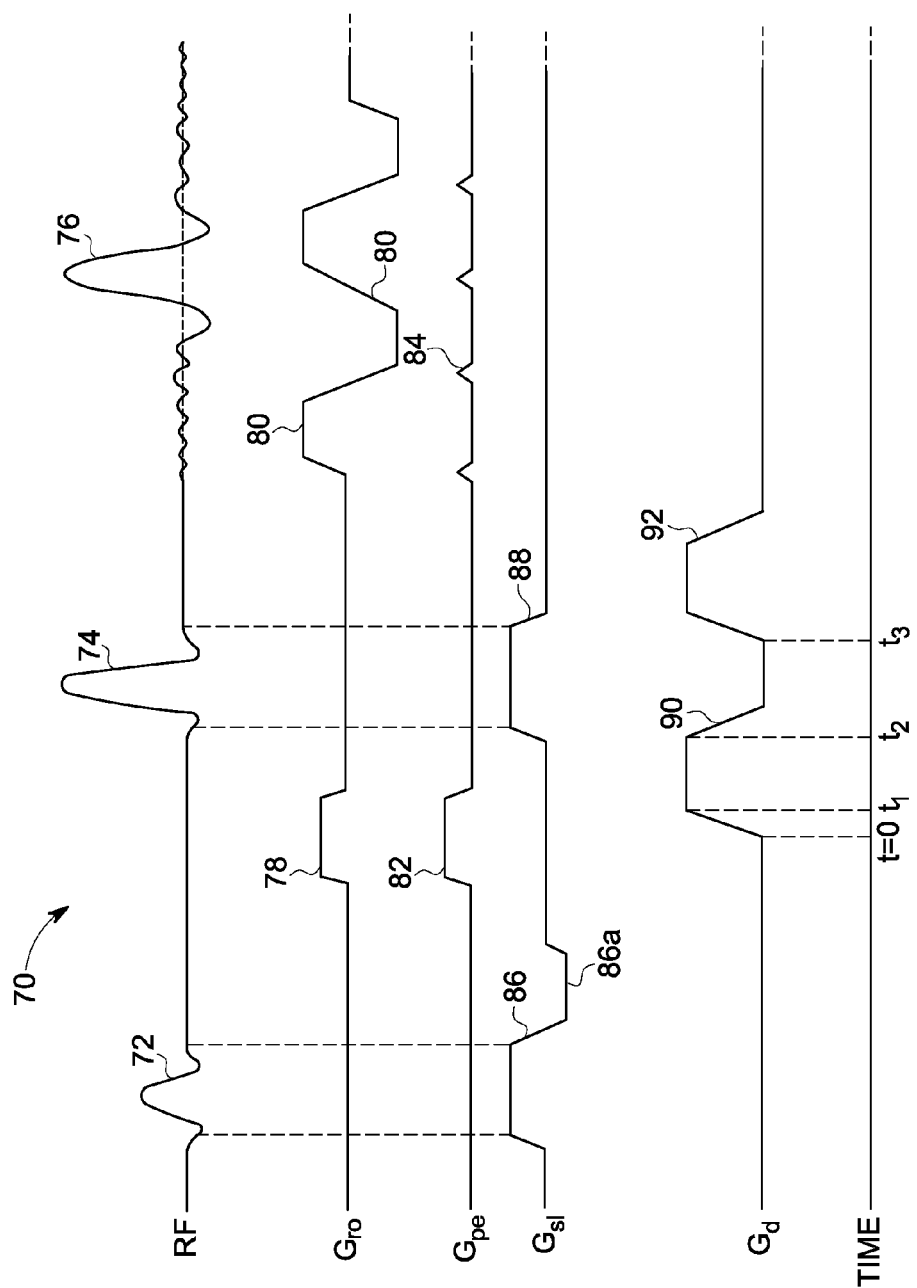
FIG. 2 is a pulse sequence diagram showing ideal gradient and RF waveforms for a single spin echo diffusion-weighted EPI scan.

Referring to FIG. 2, a DW-EPI pulse sequence 70 is shown including 90° and 180° RF pulses 72 and 74, respectively. RF pulses 72, 74 can be transmitted by RF coil 56 to generate an echo signal 76, which can be encoded with spatial information. Echo signal 76 can also be received by coil 56 or by another coil, such as a surface coil, for use in reconstructing an image.

To spatially encode echo signal 76 in accordance with echo planar imaging, the sequence shown in FIG. 2 further includes read-out, phase-encoding, and slice-selection gradients $G_{ro}$, $G_{pe}$, and $G_{sl}$, respectively. Readout gradient $G_{ro}$ comprises a pre-phasing pulse 78 and read-out pulses 80. Similarly, phase-encoding gradient $G_{pe}$ comprises a pre-phasing pulse 82 and phase-encoding pulses 84. Slice-selection gradient $G_{sl}$ comprises slice selection pulses 86 for the 90° RF pulse 72 and 88 for the 180° RF pulse 74, as well as 86a for slice refocusing.

Still referring to FIG. 2, there is shown diffusion-weighting gradient $G_d$, used in a diffusion-weighted EPI scan. Diffusion-weighting gradient $G_d$ comprises two equivalent trapezoidal pulses 90 and 92, placed at either side of the 180° RF pulse 74. Note that in general, $G_d$ can contain components on all three logical axes. In the following, the read-out, phase-encoding, and slice axes (i.e., the logical axes) are denoted as u, v, and w respectively, and the components of $G_d$ in u, v, and w axes are denoted as $G_u$, $G_v$, and $G_w$, respectively. The physical axes are denoted as x, y, and z.

Figure 3:
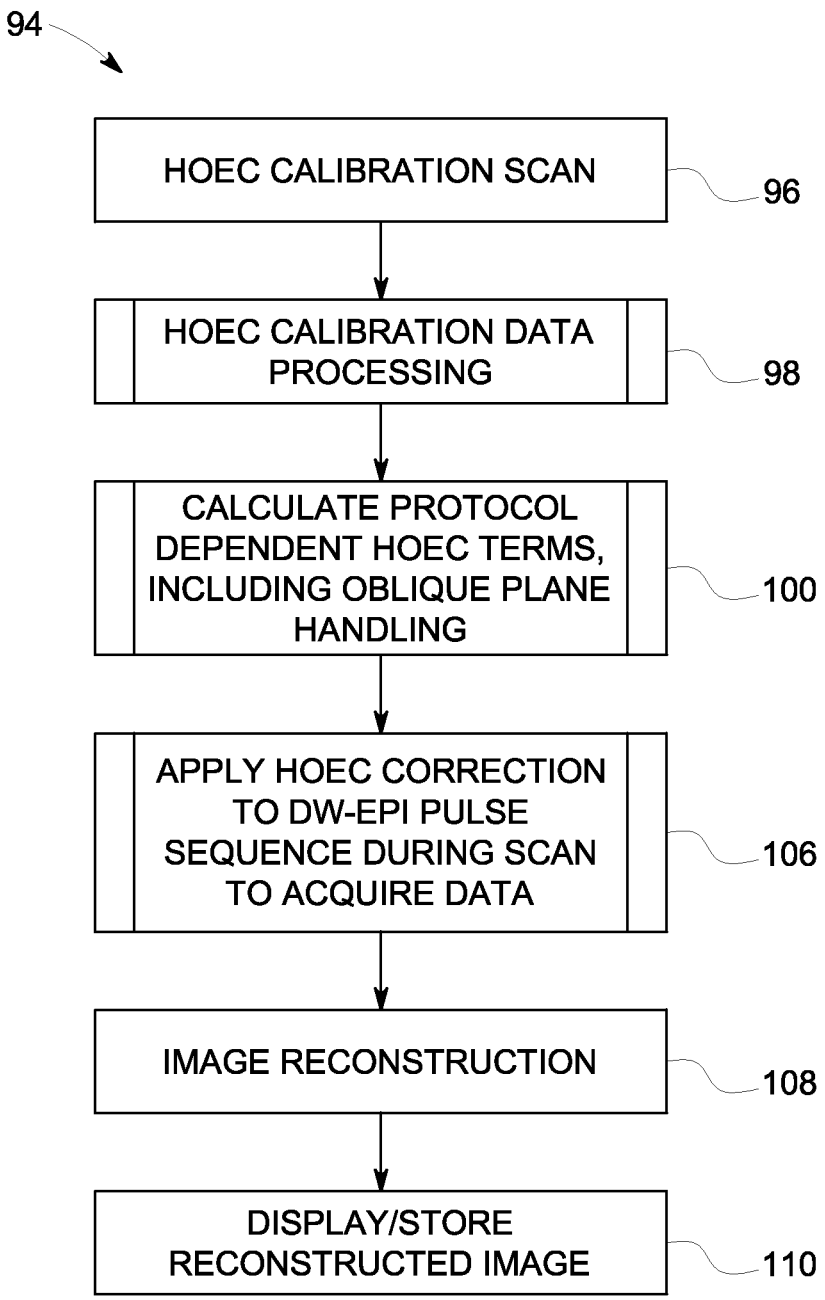
FIG. 3 is a flowchart showing an HOEC correction technique according to an embodiment of the invention.

FIG. 3 shows an HOEC correction technique 94 according to an embodiment of the invention. Technique 94 begins at block 96 by performing an HOEC calibration to characterize the eddy-current-generated magnetic field error of a particular imaging system such as MRI system 10 of FIG. 1. The calibration can either be phantom-based or local-pickup-coil-based. In the phantom-based method, gradient echo images are often collected at multiple time points following an eddy current generating gradient. In the local-pickup-coil-based method, a number of local coils, each with a small sample, are used to obtain free induction decay signals at their respective spatial locations. To use the local pickup coil method for HOEC measurement, multiple data acquisitions are often needed where the coil fixture is repositioned at each acquisition so that sufficient data are obtained for HOEC characterization. The HOEC calibration can be done as frequently as needed, but is in general only needed once per system installation or when there are significant system hardware (e.g., gradient coil) changes. A 4-dimensional (3D in space and 1D in time) eddy current field data set is generated after HOEC calibration scan.

Figure 4:
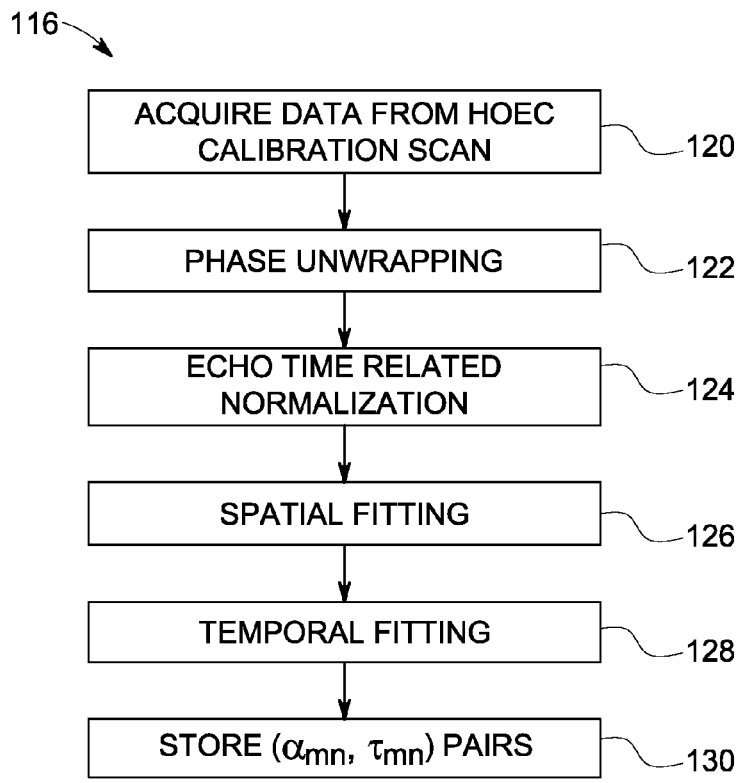
FIG. 4 is a flowchart showing an HOEC calibration data processing algorithm that may be used in the HOEC correction technique of FIG. 3 according to an embodiment of the invention.
Figure 5:
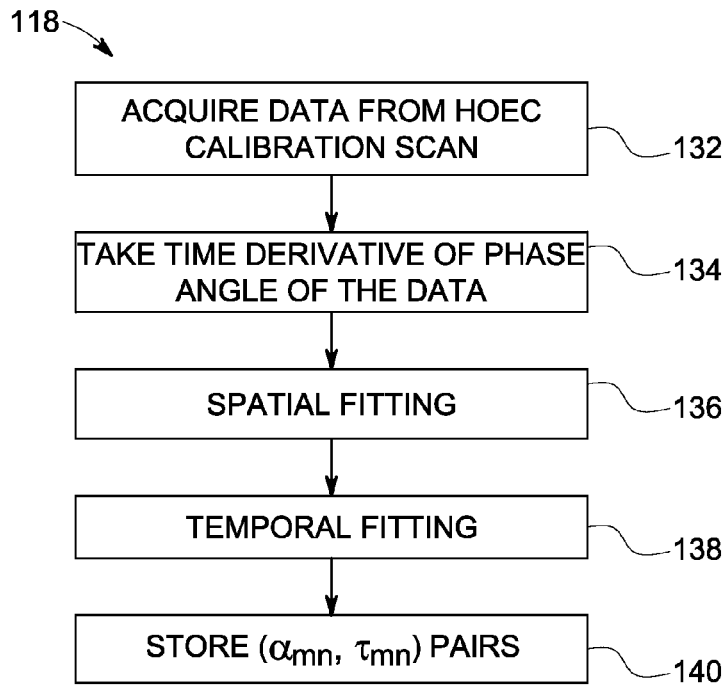
FIG. 5 is a flowchart showing another HOEC data processing algorithm that may be used in the HOEC correction technique of FIG. 3 according to an embodiment of the invention.

At block 98, data from the HOEC calibration of block 96 are first preprocessed and then fitted to mathematical models to characterize the underlying HOEC according to an algorithm based on which of the abovementioned calibration methods is used in block 96. FIGS. 4 and 5 illustrate HOEC data processing algorithms 116, 118 that may be used in block 98 of the HOEC correction technique 94 of FIG. 3 according to an embodiment of the invention.

Referring to FIG. 4, HOEC data processing algorithm 116 is used when the HOEC calibration of block 96 of technique 94 is performed using the phantom-based method as described above. Data from the HOEC calibration scan are acquired at block 120. At block 122, a 3D phase unwrapping is applied to the phase angle of the data, and the phase angle is scaled at block 124 by a factor proportional to the echo time to yield a magnetic field data set. Each time point of the magnetic field data set is then spatially fitted at block 126 to polynomial or spherical harmonic bases of order up to P to generate basis coefficients, where P is usually 3 to 5, but can be any order in general. Note that magnitude weights or masks can be optionally used during the spatial fitting.

The resulting basis coefficients are then temporal fitted along the time axis at block 128 using a single-exponential or multi-exponential model. The end results of HOEC data processing is a set of ($\alpha_{mn}$, $\tau_{mn}$) pairs, where $\alpha_{mn}$ are basis coefficients and $\tau_{mn}$ are time constants (for notational simplicity, a single exponential is assumed) of the nth spatial basis function $B_n$(x, y, z), n=1,2, . . . ,N, with diffusion donor axis m, where m is the x, y, or z axis. $B_n$(x, y, z) are assumed to be polynomial bases for convenience of discussion. Note that this is without any loss of generalization because spherical harmonic bases are linear combinations of polynomial bases and can be easily converted into polynomials. Note also that the total number of bases N=(P+1)(P+2)(P+3)/6. The ($\alpha_{mn}$, $\tau_{mn}$) pairs are saved or stored on the host computer of the scanner for future use at block 130.

Referring to FIG. 5, HOEC data processing algorithm 118 is used when the HOEC calibration of block 96 of technique 94 is performed using the local-pickup-coil-based method as described above. Data from the HOEC calibration scan are acquired at block 132. At block 134, time derivatives are taken on the phase angle of the data to obtain the magnetic field offset at a coil location. Each time point of the magnetic field offset is then spatially fitted at block 136 to polynomial or spherical harmonic bases of order up to P to generate basis coefficients, where P is usually 3 to 5, but can be any order in general. As noted above, magnitude weights or masks can be optionally used during the spatial fitting.

Similar to that described above with respect to HOEC data processing algorithm 116, the resulting basis coefficients are then temporal fitted along the time axis at block 138, and a set of ($\alpha_{mn}$, $\tau_{mn}$) pairs is generated. The ($\alpha_{mn}$, $\tau_{mn}$) pairs are saved or stored on the host computer of the scanner for future use at block 140.

Similar to the HOEC calibration scan of block 96 of technique 94, the HOEC data processing performed in HOEC data processing algorithms 116 and 118 only needs to be done once per system installation. However, algorithms 116 and 118 can be performed as frequently as needed.

Figure 6:
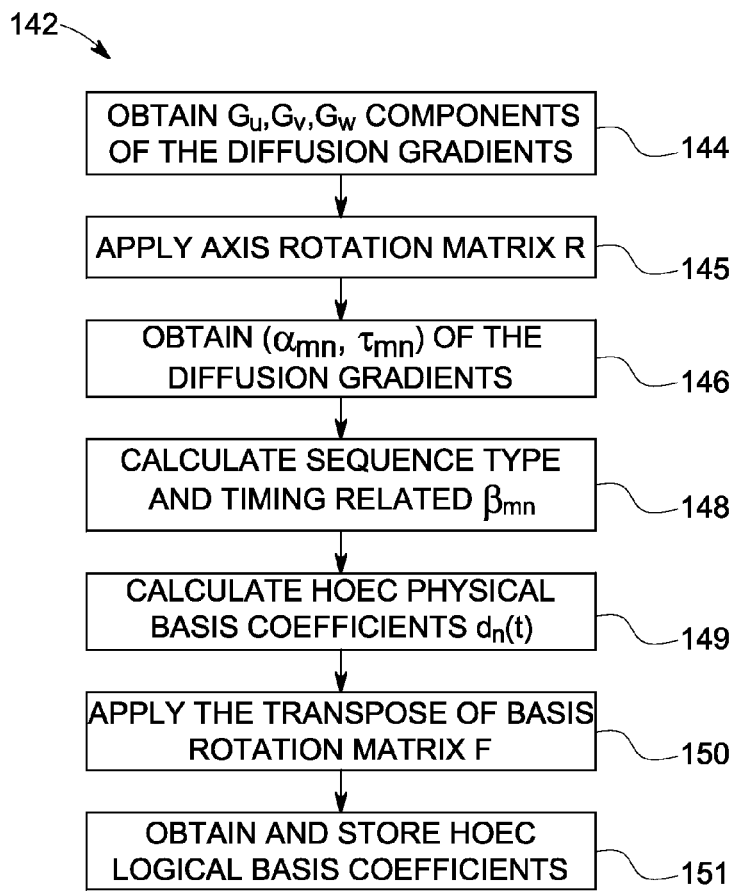
FIG. 6 is a flowchart showing an algorithm for calculating HOEC terms that may be used in the HOEC correction technique of FIG. 3 according to an embodiment of the invention.

Referring back to FIG. 3, DW-EPI protocol dependent HOEC terms are calculated at block 100. Note that block 100 can handle arbitrary imaging planes. As used herein, an arbitrary imaging plane means straight axial, coronal, or sagittal scan plane, as well as any oblique plane. As shown in FIG. 6, an algorithm 142 for calculating the HOEC terms for block 100 of FIG. 3 is shown. At block 144, the diffusion gradient components $G_u$, $G_v$, $G_w$ of the DW-EPI pulse sequence to be used are obtained. At block 145, logical gradients $G_u$, $G_v$, $G_w$ are converted to physical components $G_x$, $G_y$, $G_z$ by applying the 3×3 axis rotation matrix R:

$$\begin{bmatrix} G_x \\ G_y \\ G_z \end{bmatrix} = R \begin{bmatrix} G_u \\ G_v \\ G_w \end{bmatrix},$$

where $$R = \begin{bmatrix} r_{11} & r_{12} & r_{13} \\ r_{21} & r_{22} & r_{23} \\ r_{31} & r_{32} & r_{33} \end{bmatrix},$$

Note that R is a unitary matrix (i.e., $R^{-1} = R^T$).

At block 146, the ($\alpha_{mn}$, $\tau_{mn}$) pairs determined via block 98 from the HOEC calibration scan at block 96 of technique 94 are obtained, and the pulse sequence type and sequence timing related constant, $\beta_{nm}$, is calculated at block 148.

Derivation of $\beta_{nm}$ can either be analytical or using convolution. Although all gradient waveforms can be included to obtain $\beta_{nm}$, contributions from the diffusion gradients are often dominant, which allow for simplified analysis to obtain $\beta_{nm}$. For example, when single spin echo DW-EPI is used such as that shown in FIG. 2, it can be derived that:

$$\beta_{m,n} = \frac{\left(1 - e^{\frac{t_1}{\tau_{mn}}}\right)\left(1 - e^{\frac{t_2}{\tau_{mn}}}\right)\left(1 + e^{\frac{t_3}{\tau_{mn}}}\right)}{t_1}, \quad \text{(Eqn. 1)}$$

where $t_1$, $t_2$, and $t_3$ are sequence timing related constants shown in FIG. 2. Note that $\beta_{nm}$ for other pulse sequences such as the dual spin echo or stimulated echo DW-EPI can also be determined analytically.

At block 149, the HOEC physical basis coefficients $d_n(t)$ for the nth basis function $B_n(x, y, z)$ at time t after the last diffusion gradient are calculated based on the equation:

$$d_n(t) = \sum_{m=x,y,z} G_m \beta_{mn} \alpha_{mn} \tau_{mn} e^{-t/\tau_{mn}}, \quad \text{(Eqn. 2)}$$

where $G_m$ is the x, y, or z component of the diffusion gradient amplitude.

At block 150, the transpose of another rotation matrix, the basis rotation matrix F, is applied to $d_1(t), d_2(t), ..., d_N(t)$ to convert them into HOEC logical basis coefficients $c_1(t), c_2(t), ..., c_N(t)$:

$$\begin{bmatrix} c_1(t) \\ c_2(t) \\ \vdots \\ c_N(t) \end{bmatrix} = F^T \begin{bmatrix} d_1(t) \\ d_2(t) \\ \vdots \\ d_N(t) \end{bmatrix},$$

where "T" denotes matrix transpose. F is an N×N matrix that transforms polynomial bases from logical to physical coordinates. The actual form of F depends on the polynomial order and how the basis functions are numbered. Without loss of generality, the bases are in the following order: 1, x, y, z, $x^2$, xy, xz, $y^2$, yz, $z^2$, $x^3$, $x^2 y$, $x^2 z$, $xy^2$, xyz, $xz^2$, $y^3$, $y^2 z$, $yz^2$, $z^3$, ..., where lower order bases lead higher order bases, and for bases that have the same polynomial order, the ones that have higher x exponent lead, or, in case of the same x exponent, the ones that have higher y exponent lead. F can be determined by the relationship between $B_n(x,y,z)$ and $B_n(u,v,w)$, where $$\begin{bmatrix} x \\ y \\ z \end{bmatrix} = R \begin{bmatrix} u \\ v \\ w \end{bmatrix}.$$

For example, for up to $-2^{nd}$ order polynomials,

At block 151, all HOEC logical basis coefficients are saved for future use.

Figure 7:
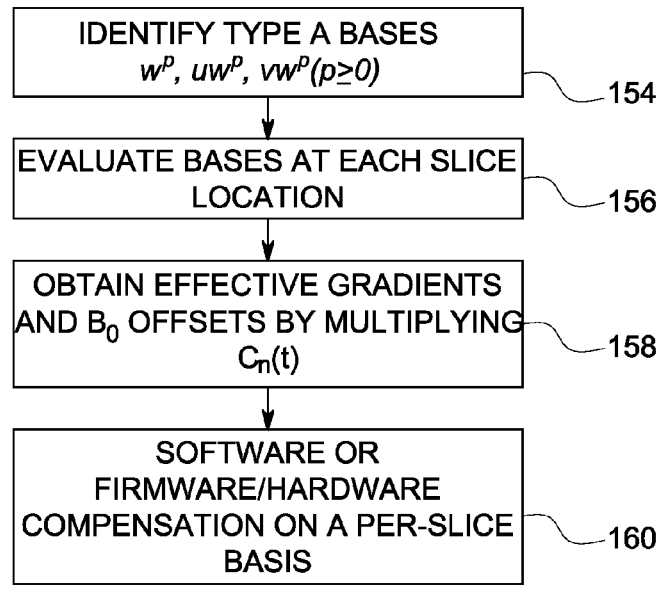
FIG. 7 is a flowchart showing an algorithm for prospective compensation of HOEC terms that may be used in the HOEC correction technique of FIG. 3 according to an embodiment of the invention.

Referring back to FIG. 3, the protocol dependent HOEC terms can be compensated for in technique 94 prospectively in the DW-EPI pulse sequence. Prospective compensation includes applying HOEC correction to the DW-EPI pulse sequence used during an imaging scan at block 106. FIG. 7 illustrates a prospective compensation algorithm 152 for block 106 according to an embodiment of the invention. Note that due to the application of F, bases are now in logical axes. Basis functions with their form being $w^p$, $uw^p$, $vw^p$ ($p \geq 0$) are referred to herein as type A terms. All the remaining basis functions (e.g., uv, $u^2 w$) are referred to herein as type B terms.

At block 154, type A terms are identified. Type A terms are quasi linear in the sense that they become linear $G_u$, $G_v$, $G_w$ gradients or $B_0$ offset when evaluated at a given slice location $w=w_0$. Bases at each slice location are evaluated at block 156, and the effective gradient from basis $uw^p$ or $vw^p$, or the $B_0$ offset from basis $w^p$ can be obtained at block 158 by multiplying the corresponding $c_n(t)$ with $w_0^p$ for the slice at $w=w_0$. Note that these $G_u$, $G_v$, $G_w$ gradients cause shear distortion, FOV compression/expansion, and signal loss, respectively, and the $B_o$ offset causes FOV shift.

At block 160, all type A terms can be compensated either at the software level (i.e., pulse sequence) or at the firmware/hardware level. For the software compensation, DW-EPI pulse sequence elements such as readout, phase encoding, and slice gradients, and receiver frequency are adjusted on a per-slice basis in the pulse sequence. For the firmware/hardware compensation, the pulse sequence commands remain unchanged, but the actual gradient waveforms and center frequency offsets are augmented behind the scene by firmware/hardware commands on a per-slice basis. For example, the unmodified pulse sequence commands may be provided to an amplifier input such as an input to a gradient amplifier 42 of FIG. 1. Then, the gradient amplifier input may be controlled by firmware/hardware compensation to adjust one or more of the DW-EPI pulse sequence elements received. Either way, a time-varying compensation is preferred, which includes but is not limited to a true exponential, a piecewise linear (or high order), or piecewise constant compensation. The compensation could also be constant throughout the echo train for simplicity, in which case the correction at the echo corresponding to the k-space center (i.e., at echo time) is applied to the whole echo train.

Referring back to FIG. 3, after the HOEC terms are prospectively compensated for at block 106, an image can be reconstructed based on the compensated data at block 108. The reconstructed image may be displayed to a user or stored on an image storage database for future use at block 110.

According to embodiments of the invention, compensation of HOEC-induced distortions for DW-EPI can make single $$F = \begin{bmatrix} 1 & 0 & 0 & 0 & 0 & 0 & 0 & 0 & 0 & 0 \\ 0 & r_{11} & r_{12} & r_{13} & 0 & 0 & 0 & 0 & 0 & 0 \\ 0 & r_{21} & r_{22} & r_{23} & 0 & 0 & 0 & 0 & 0 & 0 \\ 0 & r_{31} & r_{32} & r_{33} & 0 & 0 & 0 & 0 & 0 & 0 \\ 0 & 0 & 0 & 0 & r_{11}^2 & r_{12}^2 & r_{13}^2 & 2r_{11}r_{12} & 2r_{11}r_{13} & 2r_{12}r_{13} \\ 0 & 0 & 0 & 0 & r_{21}^2 & r_{22}^2 & r_{23}^2 & 2r_{21}r_{22} & 2r_{21}r_{23} & 2r_{22}r_{23} \\ 0 & 0 & 0 & 0 & r_{31}^2 & r_{32}^2 & r_{33}^2 & 2r_{31}r_{32} & 2r_{31}r_{33} & 2r_{32}r_{33} \\ 0 & 0 & 0 & 0 & r_{11}r_{21} & r_{12}r_{22} & r_{13}r_{23} & r_{11}r_{22}+r_{12}r_{21} & r_{11}r_{23}+r_{13}r_{21} & r_{12}r_{23}+r_{13}r_{22} \\ 0 & 0 & 0 & 0 & r_{11}r_{31} & r_{13}r_{32} & r_{13}r_{33} & r_{11}r_{32}+r_{12}r_{31} & r_{11}r_{33}+r_{13}r_{31} & r_{12}r_{33}+r_{13}r_{32} \\ 0 & 0 & 0 & 0 & r_{21}r_{31} & r_{22}r_{32} & r_{23}r_{33} & r_{21}r_{32}+r_{22}r_{31} & r_{21}r_{33}+r_{23}r_{31} & r_{22}r_{33}+r_{23}r_{32} \end{bmatrix}.$$

spin echo DW-EPI more practical. While, single spin echo has SNR and scan time benefits over dual spin echo DWI, embodiments of the invention can also be applied to dual spin echo and other variants of DW-EPI sequences to reduce distortion. Embodiments of the invention can produce a significant leverage of whole body DWI, which may have a long scan time, low SNR, and large image distortions. Brain DWI may benefit as well, especially for high b-value, large parallel imaging factor cases where SNR can be a problem.

A technical contribution for the disclosed method and apparatus is that it provides for a computer implemented correction of high order eddy-current-induced distortion in diffusion-weighted echo planar imaging.

One skilled in the art will appreciate that embodiments of the invention may be interfaced to and controlled by a computer readable storage medium having stored thereon a computer program. The computer readable storage medium includes a plurality of components such as one or more of electronic components, hardware components, and/or computer software components. These components may include one or more computer readable storage media that generally stores instructions such as software, firmware and/or assembly language for performing one or more portions of one or more implementations or embodiments of a sequence. These computer readable storage media are generally non-transitory and/or tangible. Examples of such a computer readable storage medium include a recordable data storage medium of a computer and/or storage device. The computer readable storage media may employ, for example, one or more of a magnetic, electrical, optical, biological, and/or atomic data storage medium. Further, such media may take the form of, for example, floppy disks, magnetic tapes, CD-ROMs, DVD-ROMs, hard disk drives, and/or electronic memory. Other forms of non-transitory and/or tangible computer readable storage media not list may be employed with embodiments of the invention.

A number of such components can be combined or divided in an implementation of a system. Further, such components may include a set and/or series of computer instructions written in or implemented with any of a number of programming languages, as will be appreciated by those skilled in the art. In addition, other forms of computer readable media such as a carrier wave may be employed to embody a computer data signal representing a sequence of instructions that when executed by one or more computers causes the one or more computers to perform one or more portions of one or more implementations or embodiments of a sequence.

Therefore, according to an embodiment of the invention, an MRI apparatus comprises a magnetic resonance imaging (MRI) system having a plurality of gradient coils positioned about a bore of a magnet, and an RF transceiver system and an RF switch controlled by a pulse module to transmit RF signals to an RF coil assembly to acquire MR images. The MRI apparatus also comprises a computer programmed to acquire calibration data from a calibration scan, the calibration data configured to characterize high order eddy-current-generated magnetic field error of an imaging system. The computer is also programmed to process the calibration data to generate a plurality of basis coefficients and a plurality of time constants and to calculate a plurality of basis correction coefficients based on the plurality of basis coefficients, the plurality of time constants, and gradient waveforms in a given pulse sequence. The computer is further programmed to execute a diffusion-weighted imaging scan that comprises application of a DW-EPI pulse sequence to acquire MR data from an imaging subject and reconstruction of an image based on the acquired MR data. The computer is also programmed to apply high order eddy-current-generated magnetic field error correction during application of the DW-EPI pulse sequence configured to reduce high order eddy-current-induced distortion in the reconstructed image.

According to another embodiment of the invention, a method for correcting high order eddy-current-induced distortions in diffusion-weighted echo planar imaging (DW-EPI) comprises acquiring calibration data from a calibration scan, the calibration data configured to characterize high order eddy currents of an imaging system, processing the calibration data to generate a plurality of basis coefficients and a plurality of time constants, and calculating a plurality of basis correction coefficients based on the plurality of basis coefficients and based on the plurality of time constants. The method also comprises applying a DW-EPI pulse sequence to acquire MR data from an imaging subject, applying high order eddy current generated magnetic field error correction during application of the DW-EPI pulse sequence to reduce high order eddy-current-induced distortion in the acquired MR data, and reconstructing an image based on the acquired MR data.

According to yet another embodiment of the invention, a non-transitory computer readable medium having stored thereon a computer program comprising a set of instructions, which, when executed by a computer, causes the computer to acquire calibration data from a calibration scan configured to characterize high order eddy current generated magnetic field error of an imaging system and to process the calibration data. The set of instructions also causes the computer to generate a plurality of basis coefficients and a plurality of time constants based on the processed calibration data and to calculate a plurality of basis correction coefficients based on the plurality of basis coefficients, the plurality of time constants, and gradient waveforms in a DW-EPI pulse sequence. The set of instructions also causes of the computer to apply the DW-EPI pulse sequence to acquire MR data from an imaging subject, to apply high order eddy current generated magnetic field error correction during application of the DW-EPI pulse sequence, and to reconstruct an image based on the acquired MR data.

This written description uses examples to disclose embodiments of the invention, including the best mode, and also to enable any person skilled in the art to practice the embodiments of the invention, including making and using any devices or systems and performing any incorporated methods. The patentable scope of embodiments of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. An MRI apparatus comprising:
 a magnetic resonance imaging (MRI) system having a plurality of gradient coils positioned about a bore of a magnet, and an RF transceiver system and an RF switch controlled by a pulse module to transmit RF signals to an RF coil assembly to acquire MR images; and
 a computer programmed to:
  acquire calibration data from a calibration scan, the calibration data configured to characterize high order eddy current generated magnetic field error of an imaging system;
  process the calibration data to generate a plurality of basis coefficients and a plurality of time constants;

calculate a plurality of basis correction coefficients based on the plurality of basis coefficients, the plurality of time constants, and gradient waveforms in a given pulse sequence;

execute a diffusion-weighted imaging scan comprising:
applying a DW-EPI pulse sequence to acquire MR data from an imaging subject; and
reconstructing an image based on the acquired MR data; and apply high order eddy current generated magnetic field error correction during application of the DW-EPI pulse sequence configured to reduce high order eddy-current-induced distortion in the reconstructed image.

2. The MRI apparatus of claim 1 wherein the computer is further programmed to:
identify a basis function having a form selected from a group consisting of $w^p$, $uw^p$, $vw^p$, where p is greater than or equal to zero;
determine one of an effective gradient and a $B_0$ offset based on the identified basis function; and
adjust a pulse sequence element of the DW-EPI pulse sequence based on the determined one of the effective gradient and the $B_0$ offset during application of the DW-EPI pulse sequence.

3. The MRI apparatus of claim 2 wherein the computer, in being configured to determine the one of an effective gradient and a $B_0$ offset, is configured to multiply the one of an effective gradient and a $B_0$ offset with $w_0^p$ for the slice at $w = w_0$.

4. The MRI apparatus of claim 2 wherein the computer, in being configured to adjust the pulse sequence element of the DW-EPI pulse sequence, is configured to adjust one of a receiver frequency, a readout gradient, a phase encoding gradient, and a slice gradient on a per-slice basis.

5. The MRI apparatus of claim 1 wherein the computer is further programmed to:
identify a basis function having a form selected from a group consisting of $w^p$, $uw^p$, $vw^p$, where p is greater than or equal to zero;
determine one of an effective gradient and a $B_0$ offset based on the identified basis function; and
provide the DW-EPI pulse sequence to an amplifier input;
modify the amplifier input based on the determined one of the effective gradient and the $B_0$ offset.

6. The MRI apparatus of claim 1 wherein the computer is programmed to apply the high order eddy current generated magnetic field error correction for an arbitrary imaging plane.

7. The MRI apparatus of claim 1 wherein the computer, in being programmed to process the calibration data, is programmed to:
apply a 3D phase unwrapping to a phase angle of the calibration data;
scale the unwrapped calibration data to generate a magnetic field data set;
spatially fit the magnetic field data set to a harmonic basis to generate basis coefficients; and
temporally fit the basis coefficients along a time axis using one of a single-exponential model and a multi-exponential model.

8. The MRI apparatus of claim 1 wherein the computer, in being programmed to process the calibration data, is programmed to:
take a time derivative on a phase angle of the calibration data to obtain a magnetic field offset at a coil location;
spatially fit each time point of the magnetic field offset to a harmonic basis to generate basis coefficients; and
temporally fit the basis coefficients along a time axis using one of a single-exponential model and a multi-exponential model.

9. The MRI apparatus of claim 1 wherein the computer, in being programmed to calculate the plurality of basis correction coefficients, is programmed to calculate the plurality of basis correction coefficients based on the equation:

$$d_n(t) = \sum_{m=X,Y,Z} G_m \beta_{mn} \alpha_{mn} \tau_{mn} e^{-t/\tau_{mn}},$$

where $G_m$ is the X, Y, or Z component of the diffusion gradient amplitude, $\beta_{mn}$ is a pulse sequence type and sequence timing related constant, $\alpha_{mn}$ are basis coefficients, and $\tau_{mn}$ are time constants.

10. The MRI apparatus of claim 1 wherein the computer is further programmed to display the reconstructed image to a user.

11. A method for correcting high order eddy-current-induced distortions in diffusion-weighted echo planar imaging (DW-EPI) comprising:
acquiring calibration data from a calibration scan, the calibration data configured to characterize high order eddy currents of an imaging system;
processing the calibration data to generate a plurality of basis coefficients and a plurality of time constants;
calculating a plurality of basis correction coefficients based on the plurality of basis coefficients and based on the plurality of time constants; and
applying a DW-EPI pulse sequence to acquire MR data from an imaging subject;
applying high order eddy current generated magnetic field error correction during application of the DW-EPI pulse sequence to reduce high order eddy-current-induced distortion in the acquired MR data; and
reconstructing an image based on the acquired MR data.

12. The method of claim 11 further comprising applying the high order eddy current generated magnetic field error correction for an arbitrary imaging plane.

13. The method of claim 11 wherein applying high order eddy current generated magnetic field error correction during application of the DW-EPI pulse sequence comprises:
identifying a basis function having a form selected from a group consisting of $w^p$, $uw^p$, $vw^p$, where p is greater than or equal to zero;
determining one of an effective gradient and a $B_0$ offset based on the identified basis function; and
adjusting a pulse sequence element of the DW-EPI pulse sequence based on the determined one of the effective gradient and the $B_0$ offset during application of the DW-EPI pulse sequence.

14. The method of claim 13 wherein determining the one of an effective gradient and a $B_0$ offset comprises multiplying the one of an effective gradient and a $B_0$ offset with $w_0^p$ for the slice at $w=w_0$.

15. The method of claim 13 wherein adjusting the pulse sequence element of the DW-EPI pulse sequence comprises adjusting one of a receiver frequency, a readout gradient, a phase encoding gradient, and a slice gradient on a per-slice basis.

16. A non-transitory computer readable medium having stored thereon a computer program comprising a set of instructions, which, when executed by a computer, causes the computer to:

acquire calibration data from a calibration scan configured to characterize high order eddy current generated magnetic field error of an imaging system;

process the calibration data;

generate a plurality of basis coefficients and a plurality of time constants based on the processed calibration data;

calculate a plurality of basis correction coefficients based on the plurality of basis coefficients, the plurality of time constants, and gradient waveforms in a DW-EPI pulse sequence;

apply the DW-EPI pulse sequence to acquire MR data from an imaging subject;

apply high order eddy current generated magnetic field error correction during application of the DW-EPI pulse sequence; and reconstruct an image based on the acquired MR data.

17. The non-transitory computer readable medium of claim 16 wherein the computer is programmed to apply the high order eddy current generated magnetic field error correction for an arbitrary imaging plane.

18. The non-transitory computer readable medium of claim 16 wherein the computer is further programmed to:

identify a basis function;

determine one of an effective gradient and a $B_0$ offset based on the identified basis function; and adjust a pulse sequence element of the DW-EPI pulse sequence based on the determined one of the effective gradient and the $B_0$ offset during application of the DW-EPI pulse sequence.

19. The non-transitory computer readable medium of claim 18 wherein the computer, in being configured to adjust the pulse sequence element of the DW-EPI pulse sequence, is configured to adjust one of a receiver frequency, a readout gradient, a phase encoding gradient, and a slice gradient on a per-slice basis.

20. The non-transitory computer readable medium of claim 16 wherein the computer, in being programmed to calculate the plurality of basis correction coefficients, is programmed to calculate the plurality of basis correction coefficients based on the equation:

$$d_n(t) = \sum_{m=X,Y,Z} G_m \beta_{mn} \alpha_{mn} \tau_{mn} e^{-t/\tau_{mn}},$$

where $G_m$ is the X, Y, or Z component of the diffusion gradient amplitude, $\beta_{mn}$ is a pulse sequence type and sequence timing related constant, $\alpha_{mn}$ are basis coefficients, and $\tau_{mn}$ are time constants.

* * * * *